US012745408B2

(12) United States Patent
Park et al.

(10) Patent No.: US 12,745,408 B2
(45) Date of Patent: Sep. 22, 2026

(54) LOGIC DEVICE AND MANUFACTURING METHOD THEREOF

(71) Applicant: SAMSUNG ELECTRONICS CO., LTD., Suwon-si (KR)

(72) Inventors: Won Ji Park, Suwon-si (KR); Sunoo Kim, Suwon-si (KR); Jaehee Oh, Suwon-si (KR); Hyungwon Kim, Suwon-si (KR); WooSeong Jang, Suwon-si (KR); Taekyung Kim, Suwon-si (KR); Youngbin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 484 days.

(21) Appl. No.: 18/234,517

(22) Filed: Aug. 16, 2023

(65) Prior Publication Data

US 2024/0275387 A1 Aug. 15, 2024

(30) Foreign Application Priority Data

Feb. 15, 2023 (KR) ........................ 10-2023-0020157

(51) Int. Cl.
*H01L 29/06* (2006.01)
*H03K 19/08* (2006.01)
*H10D 1/00* (2025.01)
*H10D 1/68* (2025.01)

(52) U.S. Cl.
CPC ............ *H10D 1/716* (2025.01); *H03K 19/08* (2013.01); *H10D 1/042* (2025.01)

(58) Field of Classification Search
CPC .......... H01L 23/5223; H01L 21/76807; H10D 1/042; H10D 1/716
See application file for complete search history.

(56) References Cited

U.S. PATENT DOCUMENTS 6,417,535 B1 * 7/2002 Johnson ................ H10D 1/716 257/E21.018
7,432,151 B2 10/2008 Kim
7,476,922 B2 1/2009 Won et al.
(Continued)

FOREIGN PATENT DOCUMENTS

KR 10-0731138 B1 6/2007
KR 10-2014-0143930 A 12/2014

OTHER PUBLICATIONS

Korean Intellectual Property Office, Request for the Submission of an Opinion, Korean Pat. Pub. No. 10-2023-0020157, Apr. 28, 2026, all pages. (Year: 2026).*

*Primary Examiner* — Victoria K. Hall
(74) *Attorney, Agent, or Firm* — Muir Patent Law, PLLC

(57) ABSTRACT

A logic device includes a substrate; at least one first insulating layer on the substrate; a second insulating layer on the at least one first insulating layer; and a capacitor portion in the at least one first insulating layer and the second insulating layer, wherein the at least one first insulating layer includes a plurality of through-holes, the capacitor portion includes a capacitor structure including a lower electrode, a dielectric film, and an upper electrode, and the capacitor structure continuously extends along the inside of the plurality of through-holes and along an upper surface of the at least one first insulating layer around the plurality of through-holes.

18 Claims, 29 Drawing Sheets

(56) References Cited

U.S. PATENT DOCUMENTS

| | | | | |
|---|---|---|---|---|
| 8,298,902 | B2 | 10/2012 | Dalton et al. | |
| 8,648,441 | B2 | 2/2014 | Hijioka et al. | |
| 11,245,000 | B1 * | 2/2022 | Huang | H10D 1/68 |
| 11,393,801 | B2 * | 7/2022 | Shin | H01L 23/642 |
| 2002/0163029 | A1 * | 11/2002 | Dirnecker | H10D 1/68 257/E21.582 |
| 2003/0183862 | A1 * | 10/2003 | Jin | H01L 23/5223 257/E21.579 |
| 2005/0087879 | A1 * | 4/2005 | Won | H10D 1/042 257/E21.582 |
| 2014/0361403 | A1 * | 12/2014 | Cho | H10B 12/033 257/532 |
| 2015/0364474 | A1 * | 12/2015 | Kang | G06F 11/1048 257/532 |
| 2016/0071802 | A1 * | 3/2016 | Chen | H01L 23/53238 438/643 |
| 2016/0225845 | A1 * | 8/2016 | Cho | H10B 12/033 |
| 2019/0252389 | A1 * | 8/2019 | Hsu | H10B 12/033 |
| 2020/0119134 | A1 | 4/2020 | Leobandung | |
| 2021/0118618 | A1 * | 4/2021 | Shin | H01L 23/642 |
| 2021/0134873 | A1 | 5/2021 | Kwon et al. | |

* cited by examiner

LOGIC DEVICE AND MANUFACTURING METHOD THEREOF

CROSS-REFERENCE TO RELATED APPLICATION

This application claims priority to and the benefit of Korean Patent Application No. 10-2023-0020157, filed in the Korean Intellectual Property Office on Feb. 15, 2023, the entire contents of which are incorporated herein by reference.

BACKGROUND

1. Field

The present disclosure relates to a logic device and a manufacturing method thereof.

2. Description of the Related Art

The semiconductor industry field is pursuing improvement in integration density so that more passive or active devices may be integrated in a given area. Accordingly, as the degree of integration of semiconductor chips increases and digital signals are getting faster, power integrity (PI) characteristics are becoming more important, and in order to improve the power integrity (PI), there is an increasing demand for implementing capacitors with higher capacitance.

SUMMARY

An embodiment provides a logic device including a substrate; one or more first insulating layers on the substrate; a second insulating layer on the one or more first insulating layers; and a capacitor portion in the one or more first insulating layers and the second insulating layer, wherein the one or more first insulating layers include a plurality of through-holes, the capacitor portion includes a capacitor structure including a lower electrode, a dielectric film, and an upper electrode, and the capacitor structure continuously extends along the inside of the plurality of through-holes and along an upper surface of the one or more first insulating layers around the plurality of through-holes.

Another embodiment provides a logic device including a substrate; one or more first insulating layers on the substrate; a second insulating layer on the one or more first insulating layers; a capacitor portion in the one or more first insulating layers and the second insulating layer; and a plurality of wires in the one or more first insulating layers and the second insulating layer, wherein the one or more first insulating layers include a plurality of through-holes, the capacitor portion includes a lower plate layer, a capacitor structure on the lower plate layer, an interconnect member on the capacitor structure, and an upper plate layer on the interconnect member, the capacitor structure continuously extends along an upper surface of the lower plate layer and an inner surface of the plurality of through-holes and along an upper surface of the one or more first insulating layers around the plurality of through-holes, and some of the plurality of wires are electrically connected to the lower plate layer, while some other of the plurality of wires are electrically connected to the upper plate layer.

Another embodiment provides a manufacturing method of a logic device, including forming a first insulating layer on a substrate including a lower plate layer; forming a plurality of through-holes in the first insulating layer to expose the lower plate layer; forming a capacitor structure continuously extending along an upper surface of the plate layer, an inner surface of the plurality of through-holes, and an upper surface of the first insulating layer; forming a plurality of filling plugs filling the capacitor structure in the plurality of through-holes, and depositing a plate member connecting the plurality of filling plugs on the plurality of filling plugs; depositing an upper plate layer on the plate member; and forming a first wire connected to the upper plate layer and a second wire connected to the lower plate layer.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a logic device and a manufacturing method thereof according to an embodiment will be described with reference to the accompanying drawings.

Figure 1:
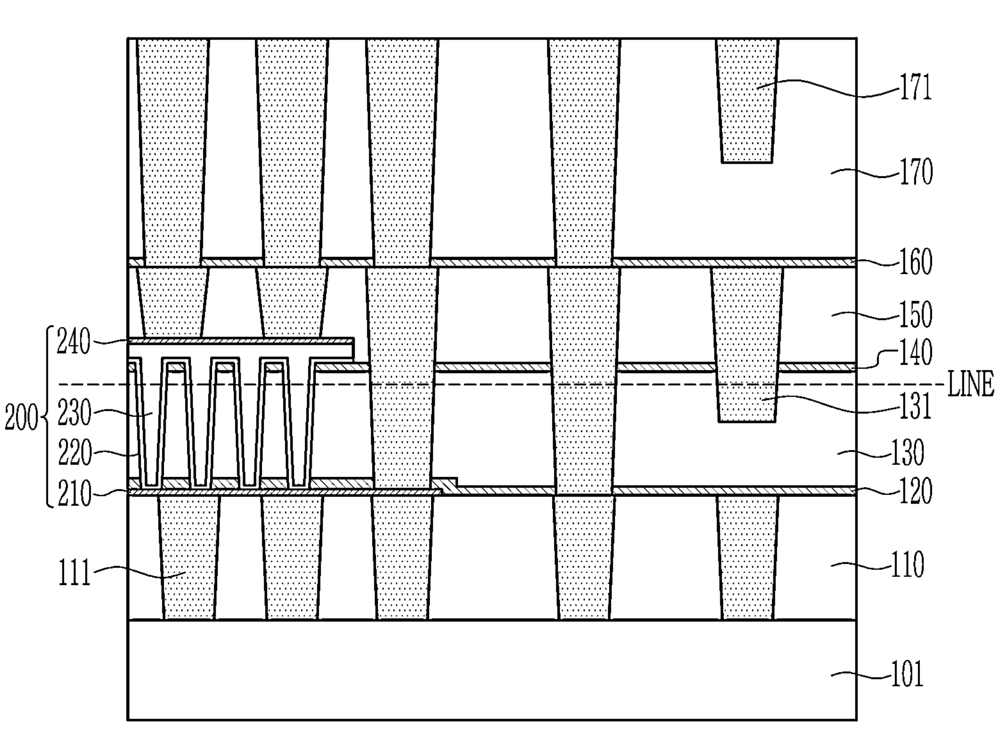
FIG. 1 illustrates a cross-sectional view of a logic device including a capacitor portion in an insulating layer.

FIG. 1 illustrates a cross-sectional view of a logic device 100 including a capacitor portion 200 within insulating layers 130 and 150. FIG. 1 illustrates a cross-sectional view taken along line A-A in a top plan view of FIG. 3. The capacitor portion 200 has a structure including a capacitor structure 220 in a plurality of through-holes, and only some of the through-holes are shown in cross-sectional views according to the present disclosure.

Referring to FIG. 1, the logic device 100 may include the capacitor portion 200, a first etch-stop layer 120, a first insulating layer 130, a second etch-stop layer 140, a second insulating layer 150, first wires 131, a third etch-stop layer 160, a third insulating layer 110, second wires 111, a fourth insulating layer 170, and third wires 171, which are disposed on a substrate 101. The substrate 101 may be any suitable substrate, e.g., a semiconductor substrate.

The capacitor portion 200 includes a lower plate layer 210, an upper plate layer 240, and a capacitor structure 220 and an interconnect member 230 that are disposed between the lower plate layer 210 and the upper plate layer 240. In an embodiment, the capacitor portion 200 may include an integrated stack capacitor (ISC). The integrated stack capacitor (ISC) may include the capacitor structure 220 that continuously extends in a vertical cylindrical structure in which tens of thousands or more capacitors are arranged, and may include a lower electrode, a dielectric film, and an upper electrode. The capacitor portion 200 according to the present disclosure may suppress power noise in a high frequency band of hundreds of MHz and have a capacitance density ten times higher than that of a metal-insulator-metal (MIM) capacitor, thereby improving power integrity (PI).

For example, as illustrated in FIG. 1, the capacitor portion 200 may be disposed within a level at which the first etch-stop layer 120, the first insulating layer 130, the second etch-stop layer 140, and the second insulating layer 150 are formed. In another example, the capacitor portion 200 may be disposed within another insulating layer. In addition, when the vertical cylindrical structure of the capacitor portion 200 is extended longer, the capacitor portion 200 may be disposed through more than two interlayer insulating layers. The capacitor portion 200 may be included in at least one of a front end of line (FEOL), a middle of line (MOL), and a back end of line (BEOL) of the logic device 100.

The first etch-stop layer 120 may be disposed between the third insulating layer 110 and the first insulating layer 130. In an area in which the capacitor portion 200 is disposed, the first etch-stop layer 120 is disposed between the lower plate layer 210 and the first insulating layer 130. The first etch-stop layer 120 may be penetrated by the first wires 131 and the capacitor structure 220. In an embodiment, the first etch-stop layer 120 may include a silicon nitride, e.g., SiN, SiCN, or SiON.

The first insulating layer 130 may be disposed on the first etch-stop layer 120. The first insulating layer 130 surrounds an outer surface of, e.g., each of, the vertical cylindrical structure of the capacitor portion 200 and the first wires 131. In an embodiment, the first insulating layer 130 may include, e.g., at least one of $SiO_2$, SiOC, SiOH, SiOCH, or a low-k dielectric layer.

Figure 2:
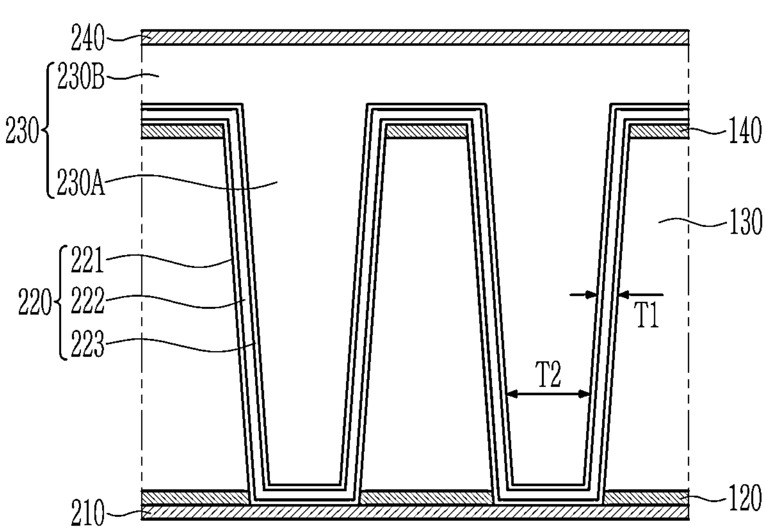
FIG. 2 illustrates a cross-sectional view of a capacitor portion including a lower plate layer, a capacitor structure, an interconnect member, and an upper plate layer.

The second etch-stop layer 140 may be disposed between the first insulating layer 130 and the second insulating layer 150. In an area in which the capacitor portion 200 is disposed, the second etch-stop layer 140 is disposed between the first insulating layer 130 and a lower electrode 221 of the capacitor structure 220 (FIG. 2). The second etch-stop layer 140 may be penetrated by the first wires 131 and the capacitor structure 220. In an embodiment, the second etch-stop layer 140 may include a silicon nitride, e.g., SiN, SiCN, or SiON.

The second insulating layer 150 may be disposed on the second etch-stop layer 140 and the upper plate layer 240 of the capacitor portion 200. The second insulating layer 150 surrounds a side surface of the capacitor structure 220 of the capacitor portion 200, a side surface of the interconnect member 230, sides and upper surfaces of the upper plate layer 240, and the first wires 131. In the embodiment, the second insulating layer 150 may include, e.g., at least one of $SiO_2$, SiOC, SiOH, SiOCH, or a low-k dielectric layer.

The third etch-stop layer 160 may be disposed on the second insulating layer 150. The third etch-stop layer 160 may be penetrated by the third wires 171. In an embodiment, the third etch-stop layer 160 may include a silicon nitride, e.g., a SiN, SiCN, or SiON.

The third insulating layer 110 may be disposed under the first etch-stop layer 120 and the lower plate layer 210 of the capacitor portion 200. The third insulating layer 110 surrounds the second wires 111. In an embodiment, the third insulating layer 110 may include, e.g., at least one of $SiO_2$, SiOC, SiOH, SiOCH, or a low-k dielectric layer.

The fourth insulating layer 170 may be disposed on the third etch-stop layer 160. The fourth insulating layer 170 surrounds the third wires 171. In an embodiment, the fourth insulating layer 170 may include at least one of $SiO_2$, SiOC, SiOH, SiOCH, or a low-k dielectric layer.

The first wires 131, the second wires 111, and the third wires 171 are disposed for electrical connection between the capacitor portion 200 and other active or passive devices, or between other active or passive devices. In an embodiment, each of the first wires 131, the second wires 111, and the third wires 171 may include Al, Cu, Sn, Ni, Au, Pt, W, or an alloy thereof.

FIG. 2 illustrates a partial enlarged cross-sectional view of the capacitor portion 200 including the lower plate layer 210, the capacitor structure 220, the interconnect member 230, and the upper plate layer 240.

Referring to FIGS. 1 and 2, the capacitor portion 200 may include the lower plate layer 210, the capacitor structure 220, the interconnect member 230, and the upper plate layer 240.

The lower plate layer 210 may be disposed between the third insulating layer 110 and the first etch-stop layer 120. The lower plate layer 210 may electrically connect the second wires 111 in the third insulating layer 110 and the lower electrode 221 of the capacitor structure 220. In addition, the lower plate layer 210 may electrically connect the first wire 131 in the first insulating layer 130 and the lower electrode 221 of the capacitor structure 220. For example, the lower plate layer 210 may include TiN. Referring to FIG. 1, an upper area of the lower plate layer 210 may be larger, e.g., wider along a horizontal direction, than the upper plate layer 240 in order to contact the first wire 131, e.g., the lower plate layer 210 may extend continuously beyond the upper plate layer 240 to contact and vertically overlap the first wire 131.

As illustrated in FIG. 2, the capacitor structure 220 may include the lower electrode 221, a dielectric film 222, and an upper electrode 223. The capacitor structure 220 may be disposed on the lower plate layer 210, and may extend on inner surfaces of through-holes 130A (see FIG. 16) formed in the first etch-stop layer 120, the first insulating layer 130, and the second etch-stop layer 140. A portion of the capacitor structure 220 may be disposed on the upper surface of the second etch-stop layer 140. For convenience, in the embodiment of FIG. 1, four through-holes 130A and the capacitor structure 220 formed on the second etch-stop layer 140 around the four through-holes 130A are shown, but the capacitor structure 220 may be continuously formed on tens of thousands of through-holes and the second etch-stop layer 140 around the through-holes 130A.

A general MIM capacitor has a horizontal capacitor structure in which a dielectric film is disposed between two horizontal plate-shaped electrodes, while in the capacitor structure according to the present disclosure, a capacitor has a vertical structure along an inner surface of each of a plurality of vertical through-holes. The capacitor formed in the vertical through-holes continuously extends along all the plurality of through-holes, which are arranged to be spaced apart from each other in the horizontal direction, so the capacitor structure according to the present disclosure has a three-dimensional capacitor structure in both the horizontal and vertical directions. Accordingly, the capacitor structure 220 according to the present disclosure may have a capacitance density that is ten times greater than that of a MIM capacitor with a horizontal capacitor structure.

The lower electrode 221 conformally, e.g., and continuously, extends along the inside of the through-holes 130A (i.e., along the upper surface of the lower plate layer 210 and the inner surface of through-hole 130A) and along the upper surface of the first insulating layer 130 around the through-holes 130A. For example, as illustrated in FIG. 2, the lower electrode 221 may continuously cover an entire inner surface of one through-hole 130A, may extend continuously outside the one through-hole 130A to cover the upper surface of the first insulating layer 130 around the through-hole 130A, and may further extend continuously to cover an entire inner surface of an adjacent through-hole 130A. For example, as illustrated in FIG. 2, a same single lower electrode 221 may continuously cover the inner surfaces of all the through-holes 130A in the first insulating layer 130.

The lower electrode 221 may penetrate the first etch-stop layer 120 to contact the lower plate layer 210 and be electrically connected to the lower plate layer 210. In an embodiment, the lower electrode 221 may have a vertical cylinder shape. In another embodiment, the lower electrode 221 may have a circular truncated cone shape. In an embodiment, the lower electrode 221 may include a metal nitride film, a metal oxide film, a metal oxynitride film, or a combination thereof. For example, the lower electrode 221 may include TiN, CON, NbN, $SnO_2$, or a combination thereof.

The dielectric film 222 conformally, e.g., and continuously, extends along the lower electrode 221 on the lower electrode 221. In an embodiment, since the dielectric film 222 conformally extends along the, e.g., entire, lower electrode 221, the dielectric film 222 may also have a vertical cylinder shape. In another embodiment, the dielectric film 222 may have a circular truncated cone shape. For example, the dielectric film 222 may include a metal oxide film, e.g., $AlO_2$, $ZrO_2$, $HfO_2$, $Nb_2O_5$, $CeO_2$, $TiO_2$, or a combination thereof. For example, the dielectric film 222 may include a multi-layered film in which $AlO_2$ and $ZrO_2$ are alternately stacked.

The upper electrode 223 conformally, e.g., and continuously, extends along the dielectric film 222 on the dielectric film 222. The upper electrode 223 may, e.g., directly, contact the interconnect member 230, and may be electrically connected to the interconnect member 230. In an embodiment, since the upper electrode 223 conformally extends along the, e.g., entire, dielectric film 222, the upper electrode 223 may also have a vertical cylinder shape. In another embodiment, the upper electrode 223 may have a circular truncated cone shape. In an embodiment, the upper electrode 223 may include a metal nitride film, a metal oxide film, a metal oxynitride film, or a combination thereof. For example, the upper electrode 223 may include TiN, CON, NbN, $SnO_2$, or a combination thereof.

The interconnect member 230 may be disposed between the capacitor structure 220 and the upper plate layer 240, and may electrically connect the capacitor structure 220 and the upper plate layer 240. The interconnect member 230 includes a first area and a second area, e.g., the first area and the second area may be integral with each other to define a single and seamless structure. The first area includes filling plugs 230A filling the through-holes 130A on the capacitor structure 220, e.g., each filling plug 230A may completely fill a corresponding one of the through-holes 130A. The second area may extend on the upper surface of the capacitor structure 220 and on the filling plugs 230A in the horizontal direction, and may overlap the second etch-stop layer 140. The second area includes a plate member 230B and may electrically connect the filling plugs 230A to the upper plate layer 240. The filling plugs 230A and the plate member 230B of the interconnect member 230 may be made of a same material to be integrally formed. In an embodiment, the interconnect member 230 may include metal, e.g., Al.

For example, as illustrated in FIG. 2, a width T2 of each of the filling plugs 230A in a horizontal direction parallel to the upper plate layer 240 may increase as a vertical distance from the lower plate layer 210 increases. For example, a width T1 of the capacitor structure 220 in the horizontal direction may be constant. For example, the width T2 of each of the filling plugs 230A (e.g., along any vertical point along the filling plug 230A) may be 2 times to 10 times thicker than the width T1 of the capacitor structure 220. A ratio of a width of each of the through-holes 130A to a width of the capacitor structure 220 may be 4:1 to 12:1.

The upper plate layer 240 may be disposed between the interconnect member 230 and the second insulating layer 150, and may be electrically connected to the first wires 131 in the second insulating layer 150. For example, the upper plate layer 240 may include TiN.

Figure 3:
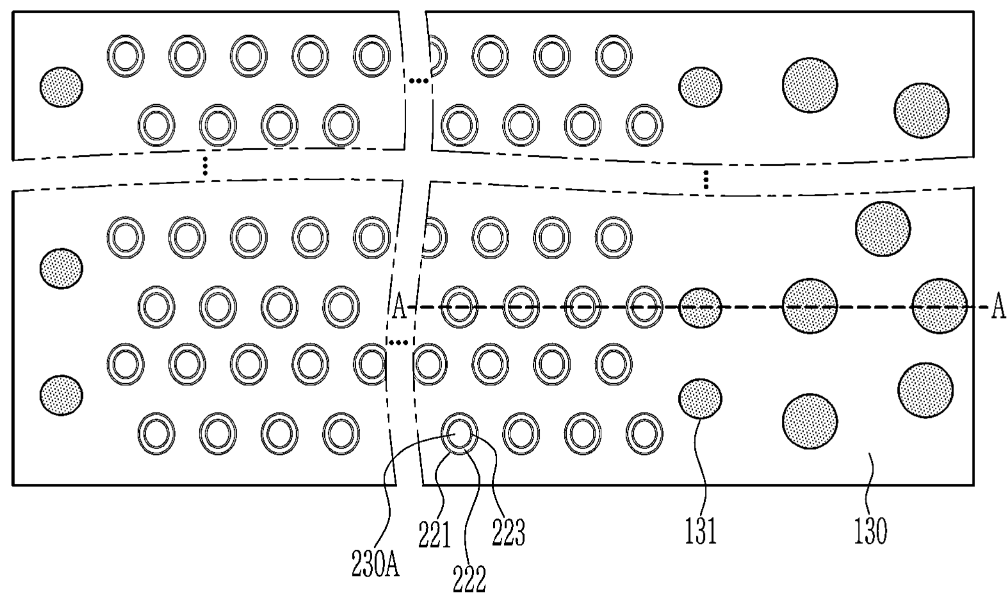
FIG. 3 illustrates a top plan view of an entire capacitor portion, a first insulating layer, and first wires at a level corresponding to 'LINE' in FIG. 1.

FIG. 3 illustrates a top plan view of the entire capacitor portion 200, the first insulating layer 130, and the first wires 131 at a level corresponding to 'LINE' in FIG. 1.

Referring to FIG. 3, a flat shape of the cylindrical structure of the capacitor portion 200 and flat shapes of the first wires 131 in the first insulating layer 130 are shown, as viewed in a top (planar) view. The lower electrode 221 is conformally disposed along the inner surface of the through-hole 130A formed in the first insulating layer 130, the dielectric film 222 is conformally disposed along the lower electrode 221, and the upper electrode 223 is conformally disposed along the dielectric film 222. The interconnect member 230 is filled inside the upper electrode 223. In addition, the first wires 131 are disposed within the first insulating layer 130. For example, as illustrated in FIG. 3, the planar cross-sectional views (i.e., flat shapes) of the cylindrical structure of the capacitor portion 200 and the first wires 131 may be circular shapes. In another example, the flat shape of the cylinder structure of the capacitor portion 200 and the flat shapes of the first wires 131 may be formed as elliptical, polygonal, or any other suitable shape.

Figure 4:
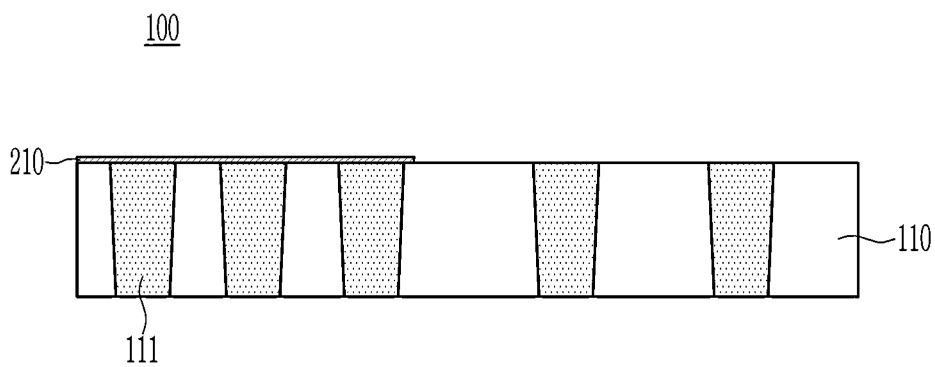
FIG. 4 illustrates a cross-sectional view of depositing a lower plate layer on a third insulating layer, in a method of manufacturing a logic device including capacitor portions.

FIG. 4 illustrates a cross-sectional view of depositing the lower plate layer 210 on the third insulating layer 110, in a method of manufacturing the logic device 100 including the capacitor portions 200.

Referring to FIG. 4, the lower plate layer 210 may be deposited on the third insulating layer 110 on which the second wires 111 are formed, e.g., the second wires 111 may extend from a top surface to a bottom surface of the third insulating layer 110. In an embodiment, the lower plate layer 210 may be formed by, e.g., a sputtering process, a physical vapor deposition (PVD) process, an atomic layer deposition (ALD) process, or a chemical vapor deposition (CVD) process.

Then, for example, a hard mask may be deposited on the lower plate layer 210, and a photoresist may be deposited on the hard mask. In another example, the depositing of the hard mask may be omitted, and the photoresist may be directly formed on the lower plate layer 210. The hard mask may include a plurality of layers stacked in a vertical direction. For example, the hard mask and the photoresist may be formed by, e.g., a sputtering process, a PVD process, an ALD process, or a CVD process. For example, the photoresist may be formed by spin coating. For example, the hard mask may include $AlO_x$, AlN, AlON, $SiO_2$, SION, or SiCN. For example, the photoresist may include an organic polymeric resin containing a photoactive material.

Then, the photoresist may be exposed and developed to form a pattern on the photoresist. The patterned photoresist may be used as an etching stop layer to etch the hard mark to form a pattern of the hard mask.

Next, a portion of the lower plate layer 210 excluding a portion in which the capacitor portion 200 is to be formed may be etched by using the hard mask as the etching stop layer. Then, an ashing process may be performed to remove the photoresist, and an etching process may be performed to remove the hard mask.

Figure 5:
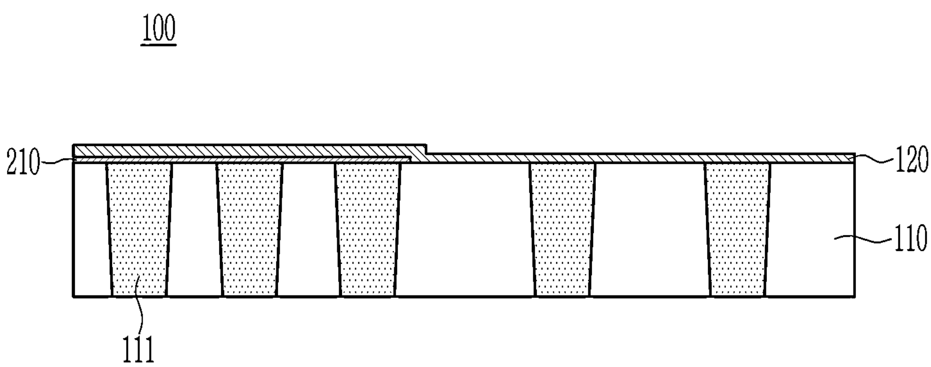
FIG. 5 illustrates a cross-sectional view of forming a first etch-stop layer on a lower plate layer and a third insulating layer, in a method of manufacturing a logic device including capacitor portions.

FIG. 5 illustrates a cross-sectional view of forming the first etch-stop layer 120 on the lower plate layer 210 and the third insulating layer 110, in the method of manufacturing the logic device 100 including the capacitor portions 200.

Referring to FIG. 5, the first etch-stop layer 120 may be deposited on the lower plate layer 210 and the third insulating layer 110. In an embodiment, the first etch-stop layer 120 may be formed by an ALD process or a CVD process.

Figure 6:
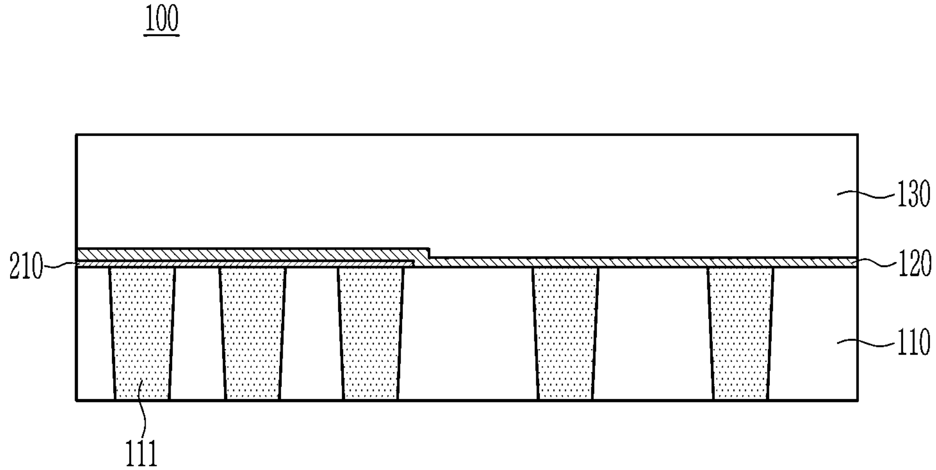
FIG. 6 illustrates a cross-sectional view of depositing a first insulating layer on a first etch-stop layer, in a method of manufacturing a logic device including capacitor portions.

FIG. 6 illustrates a cross-sectional view of depositing the first insulating layer 130 on the first etch-stop layer 120, in the method of manufacturing the logic device 100 including the capacitor portions 200.

Referring to FIG. 6, the first insulating layer 130 may be deposited on the first etch-stop layer 120. In an embodiment, the first insulating layer 130 may be deposited by a thermal CVD process, a plasma enhanced CVD process, or an ALD process. The first insulating layer 130 may be formed of a material film having etch selectivity with respect to the first etch-stop layer 120.

Figure 7:
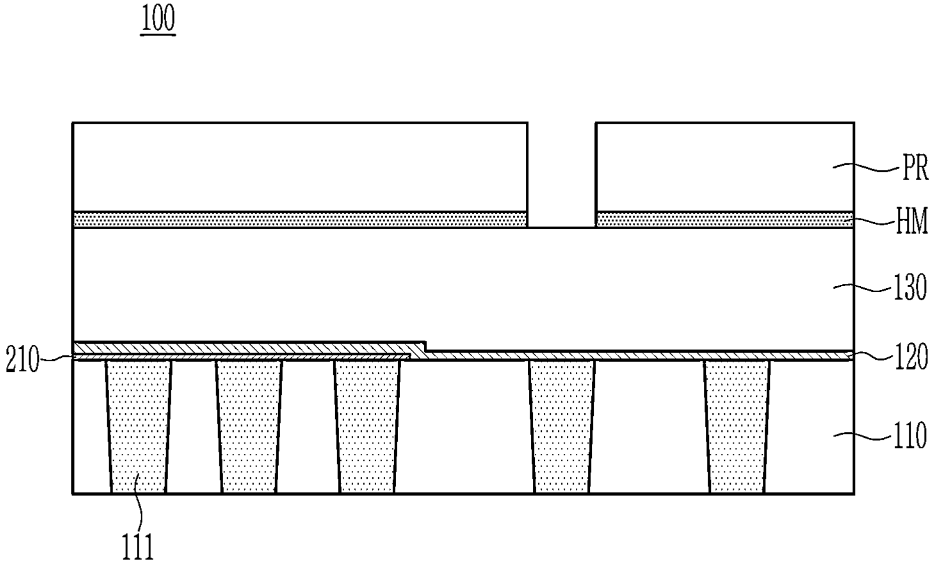
FIG. 7 illustrates a cross-sectional view of depositing a hard mask on a first insulating layer, depositing a photoresist on the hard mask, and before forming a through-hole, exposing and developing the photoresist and etching the hard mask, in a method of manufacturing a logic device including a capacitor portions.

FIG. 7 illustrates a cross-sectional view of depositing a hard mask HM on the first insulating layer 130, depositing a photoresist PR on the hard mask HM, and before forming a through-hole, exposing and developing the photoresist PR and etching the hard mask HM, in the method of manufacturing the logic device 100 including the capacitor portions 200.

Referring to FIG. 7, first, the hard mask HM may be deposited on the first insulating layer 130. Then, the photoresist PR may be deposited on the hard mask HM. Then, the photoresist PR may be exposed and developed to form a pattern of the photoresist PR. Next, the hard mark HM may be etched using the patterned photoresist PR as an etch mask to form a pattern of the hard mask HM. The contents described in FIG. 4 may be equally applied to the formation process, material, and structure of the hard mask HM and the photoresist PR illustrated in FIG. 7.

Figure 8:
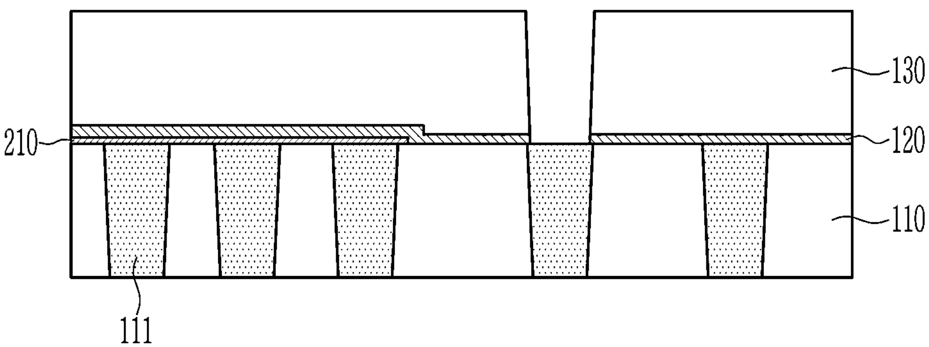
FIG. 8 illustrates a cross-sectional view of forming a through-hole in a first insulating layer, in a method of manufacturing a logic device including capacitor portions.

FIG. 8 illustrates a cross-sectional view of forming a through-hole in the first insulating layer 130, in the method of manufacturing the logic device 100 including the capacitor portions 200.

Referring to FIG. 8, the through-hole may be formed by etching the first insulating layer 130 by using the hard mask HM as an etch mask. The etching of the first insulating layer 130 is performed using an etching condition having etch selectivity with respect to the first etch-stop layer 120, and an upper surface of the first etch-stop layer 120 is exposed. The third insulating layer 110 and the second wires 111 under the first insulating layer 130 are protected from etching by the first etch-stop layer 120. Then, the exposed first etch-stop layer 120 is etched. Then, the hard mask HM and the photoresist PR may be removed by at least one of, e.g., etching, ashing, and stripping.

Figure 9:
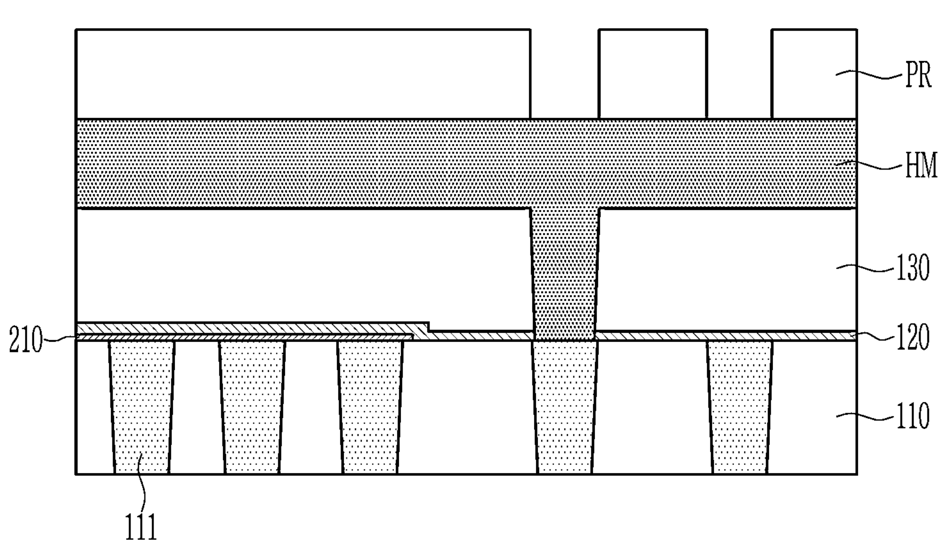
FIG. 9 illustrates a cross-sectional view of depositing a hard mask on an inner portion of a through-hole of a first insulating layer and on an upper surface of the first insulating layer, depositing a photoresist on the hard mask, and exposing and developing the photoresist, in a method of manufacturing a logic device including capacitor portions.

FIG. 9 illustrates a cross-sectional view of depositing the hard mask HM on an inner portion of the through-hole of the first insulating layer 130 and on an upper surface of the first insulating layer 130, depositing the photoresist PR on the hard mask HM, and exposing and developing the photoresist PR, in the method of manufacturing the logic device 100 including the capacitor portions 200.

Referring to FIG. 9, first, the hard mask HM may be deposited on the inside of the through-hole of the first insulating layer 130 and on the upper surface of the first insulating layer 130. Then, the photoresist PR may be deposited on the hard mask HM. Then, the photoresist PR may be exposed and developed to form a pattern of the photoresist PR. The contents described in FIG. 4 may be equally applied to the formation process, material, and structure of the hard mask HM and the photoresist PR illustrated in FIG. 9.

Figure 10:
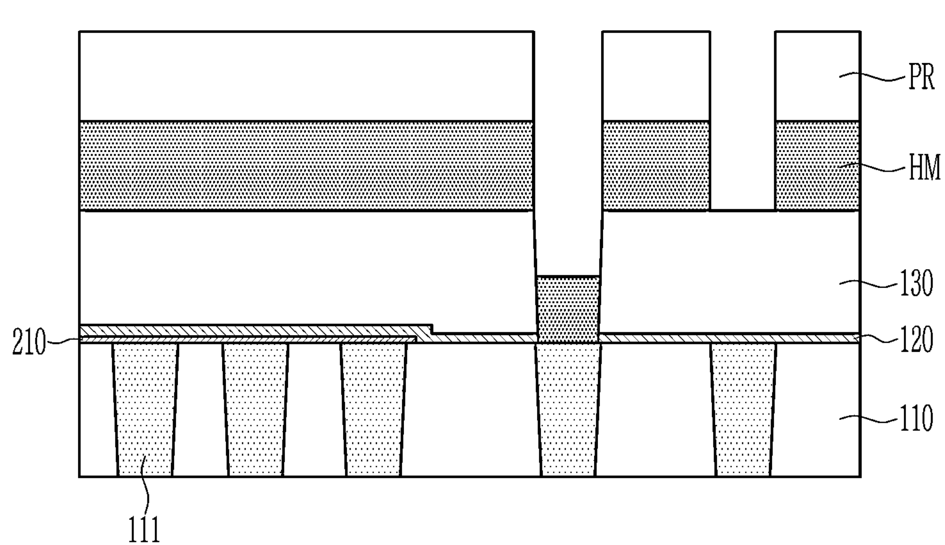
FIG. 10 illustrates a cross-sectional view of etching a hard mask, in a method of manufacturing a logic device including capacitor portions.

FIG. 10 illustrates a cross-sectional view of etching the hard mask HM, in a method of manufacturing the logic device 100 including the capacitor portions 200.

Referring to FIG. 10, the hard mask HM may be etched according to the pattern of the photoresist PR. After performing the etching process, the hard mask HM that is not etched exists in the through-hole formed in the first insulating layer 130, e.g., a portion of the hard mask HM may remain unetched at the bottom of the through-hole.

Figure 11:
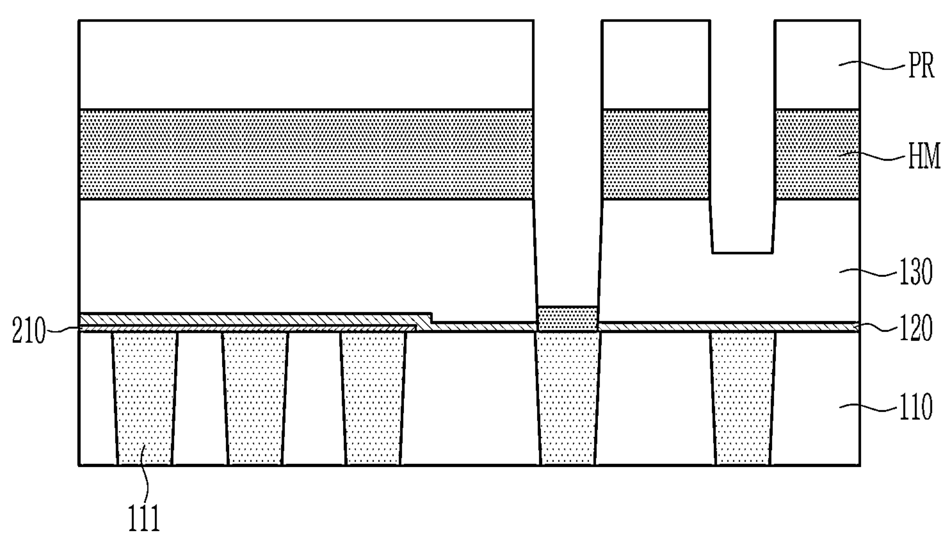
FIG. 11 illustrates a cross-sectional view of etching the remaining hard mask and second insulating layer, in a method of manufacturing a logic device including capacitor portions.

FIG. 11 illustrates a cross-sectional view of etching the remaining hard mask HM and the first insulating layer 130, in the method of manufacturing the logic device 100 including the capacitor portions 200.

Referring to FIG. 11, the hard mark HM present in the through-hole of the first insulating layer 130 is additionally etched, and the first insulating layer 130 is partially etched. Residues of the hard mask HM may exist, e.g., remain, in the through-hole of the first insulating layer 130.

Figure 12:
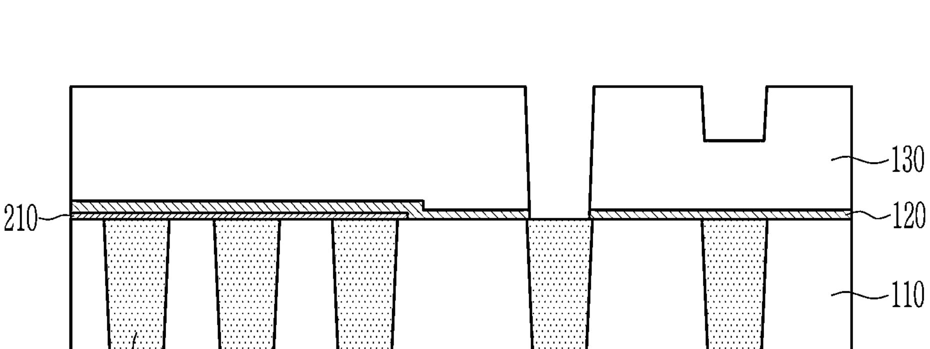
FIG. 12 illustrates a cross-sectional view of removing a residue of a hard mask by ashing, and removing the hard mask and a photoresist, in a method of manufacturing a logic device including capacitor portions.

FIG. 12 illustrates a cross-sectional view of removing the residues of the hard mask HM in the through-hole of the first insulating layer 130 by ashing, and removing the hard mask HM and the photoresist PR, in the method of manufacturing the logic device 100 including the capacitor portions 200.

Referring to FIG. 12, the residues of the hard mask HM may be removed by ashing. The hard mask HM and the photoresist PR may be removed by at least one of, e.g., etching, ashing, and stripping.

Figure 13:
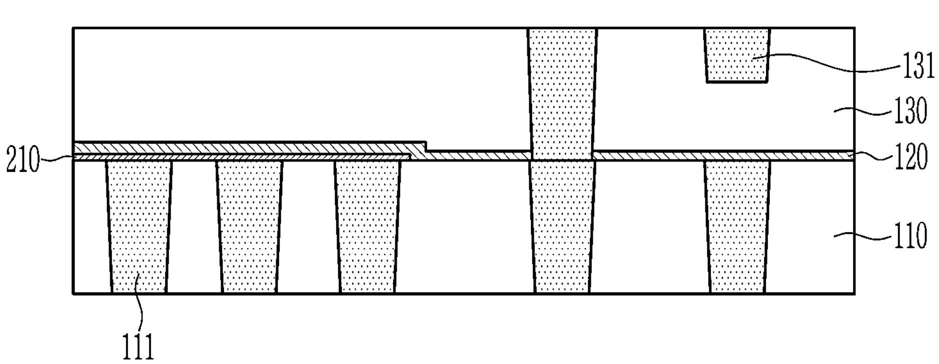
FIG. 13 illustrates a cross-sectional view of forming first wires in a first insulating layer by filling through-holes with a conductive material, in a method of manufacturing a logic device including capacitor portions.

FIG. 13 illustrates a cross-sectional view of forming the first wires 131 in the first insulating layer 130 by filling the through-holes with a conductive material, in the method of manufacturing the logic device 100 including the capacitor portions 200.

Referring to FIG. 13, the first wires 131 may be formed by filling the through-holes in the first insulating layer 130 with a conductive material. For example, the conductive material may be formed, e.g., filled in the through-holes, by a damascene process. In another example, the conductive material may be formed, e.g., filled in the through-holes, by a sputtering process, a PVD process, an ALD process, or a CVD process. In an embodiment, the conductive material may include Al, Cu, Sn, Ni, Au, Pt, W, or an alloy thereof.

Figure 14:
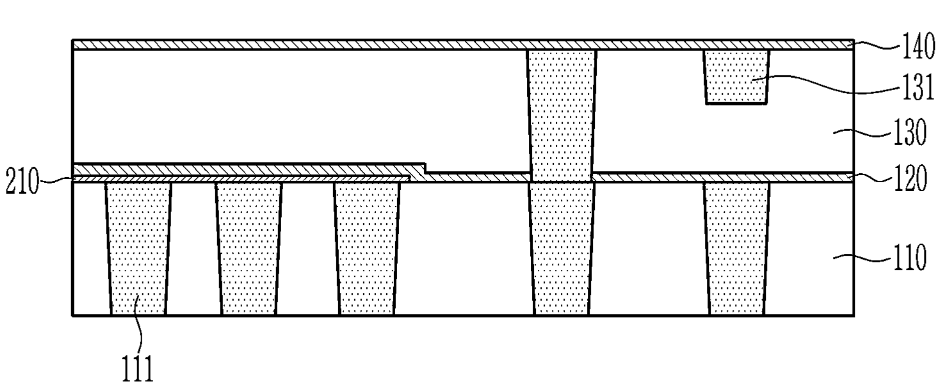
FIG. 14 illustrates a cross-sectional view of depositing a second etch-stop layer on a second insulating layer, in a method of manufacturing a logic device including capacitor portions.

FIG. 14 illustrates a cross-sectional view of depositing the second etch-stop layer 140 on the first insulating layer 130, in the method of manufacturing the logic device 100 including the capacitor portions 200.

Referring to FIG. 14, the second etch-stop layer 140 may be deposited on the first insulating layer 130. In an embodiment, the second etch-stop layer 140 may be formed by, e.g., an ALD process or a CVD process.

Figure 15:
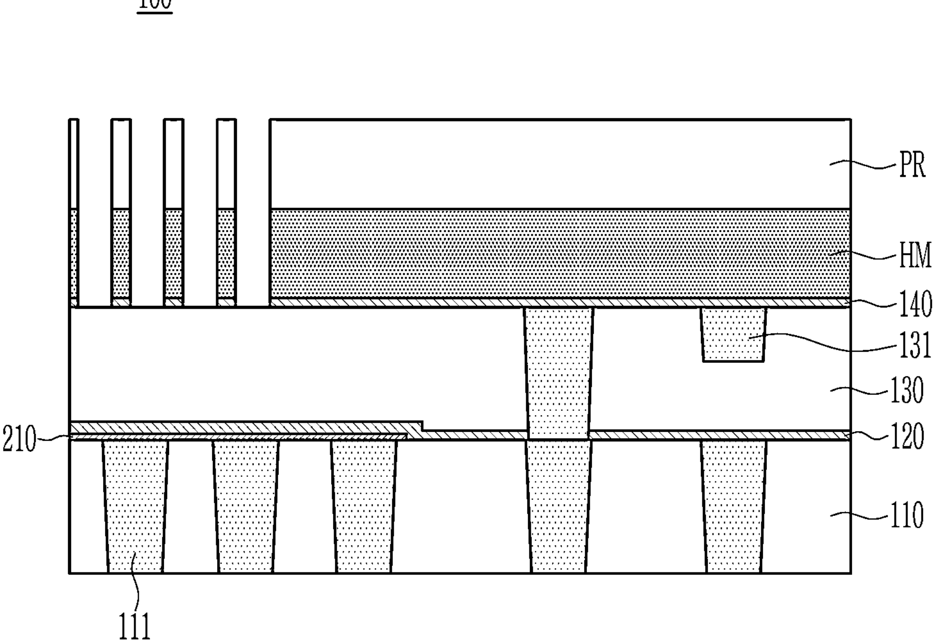
FIG. 15 illustrates a cross-sectional view of depositing a hard mask on a second etch-stop layer, depositing a photoresist on the hard mask, and before forming a capacitor structure, exposing and developing the photoresist and etching the hard mask, in a method of manufacturing a logic device including capacitor portions.

FIG. 15 illustrates a cross-sectional view of depositing the hard mask HM on the second etch-stop layer 140, depositing the photoresist PR on the hard mask HM, and before forming the capacitor structure 220, exposing and developing the photoresist PR and etching the hard mask HM, in a method of manufacturing the logic device 100 including capacitor portions 200.

Referring to FIG. 15, first, the hard mask HM may be deposited on the second etch-stop layer 140. Then, the photoresist PR may be deposited on the hard mask HM. Then, the photoresist PR may be exposed and developed to form a pattern of the photoresist PR. Next, the hard mark HM may be etched using the patterned photoresist PR as an etch mask to form a pattern of the hard mask HM. Next, the second etch-stop layer 140 may be etched using the hard mask HM as an etch mask, and the first insulating layer 130 may be exposed. The contents described in FIG. 4 may be equally applied to the formation process, material, and structure of the hard mask HM and the photoresist PR illustrated in FIG. 15.

Figure 16:
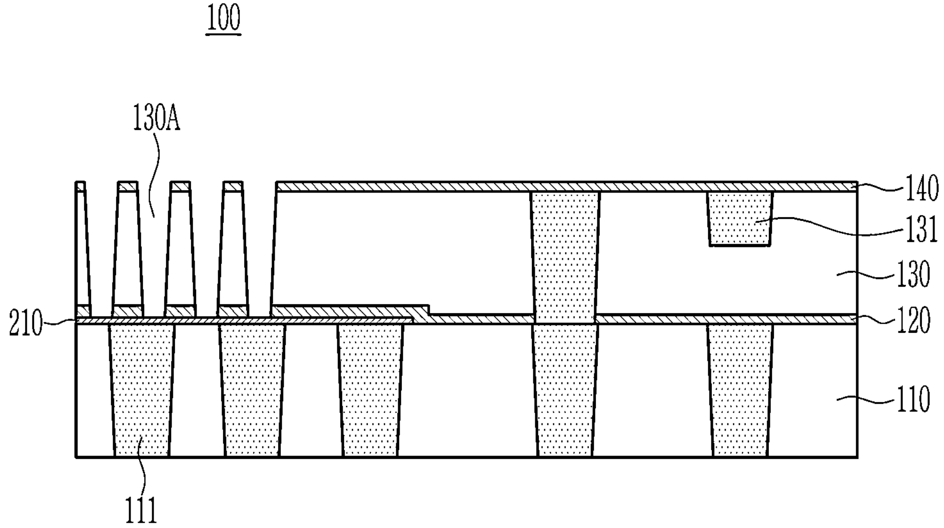
FIG. 16 illustrates a cross-sectional view forming through-holes in a first etch-stop layer and a second insulating layer and removing a hard mask and a photoresist, in a method of manufacturing a logic device including capacitor portions.

FIG. 16 illustrates a cross-sectional view of forming through-holes in the first etch-stop layer 120 and the first insulating layer 130 and removing the hard mask HM and the photoresist PR, in the method of manufacturing the logic device 100 including capacitor portions 200.

Referring to FIG. 16, the through-holes 130A may be formed by etching the first insulating layer 130 by using the hard mask HM as an etch mask. A ratio of a width of each of the through-holes 130A and a width of each of the first wires 131 may be 1:5 to 1:10. The etching of the first insulating layer 130 is performed using an etching condition having etch selectivity with respect to the first etch-stop layer 120, and an upper surface of the first etch-stop layer 120 is exposed. The lower plate layer 210 under the first insulating layer 130 is protected from etching by the first etch-stop layer 120. Then, the exposed first etch-stop layer 120 is etched. Then, the hard mask HM and the photoresist PR may be removed by at least one of etching, ashing, and stripping.

Figure 17:
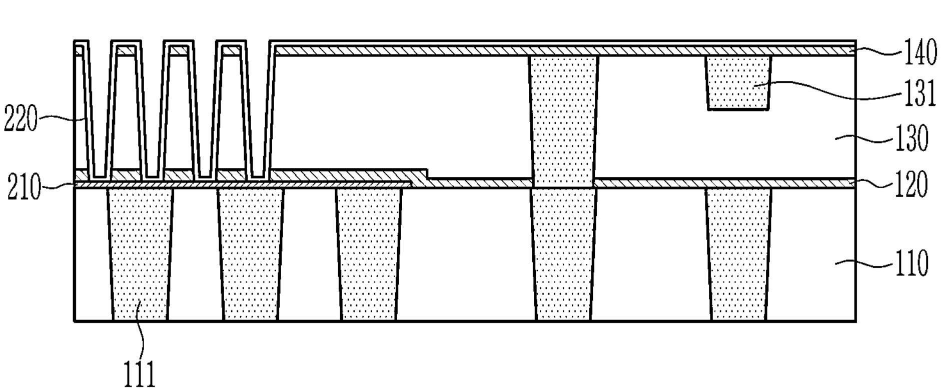
FIG. 17 illustrates a cross-sectional view of forming a capacitor structure inside through-holes and on an upper surface of a second etch-stop layer, in a method of manufacturing a logic device including capacitor portions.

FIG. 17 illustrates a cross-sectional view of forming the capacitor structure 220 inside the through-holes 130A and on the upper surface of the second etch-stop layer 140, in the method of manufacturing the logic device 100 including the capacitor portions 200.

Referring to FIG. 17, the lower electrode 221 may be conformally deposited on the inside of the through-holes 130A and on the upper surface of the second etch-stop layer 140, e.g., a single lower electrode 221 may be deposited conformally and continuously inside each of the through-holes 130A and on the upper surface of the second etch-stop layer 140 therebetween. In an embodiment, the lower electrode 221 may be formed by, e.g., a sputtering process, a PVD process, an ALD process, or a CVD process.

Then, on the lower and inner surfaces of the lower electrode 221 in the through-holes 130A, and on the upper surface of the lower electrode 221 on the upper surface of the second etch-stop layer 140, the dielectric film 222 may be conformally deposited. In an embodiment, the dielectric film 222 may be formed by, e.g., an ALD process or a CVD process.

Then, on the lower and inner surfaces of the dielectric film 222 in the through-holes 130A, and on the upper surface of the dielectric film 222 on the upper surface of the second etch-stop layer 140, the upper electrode 223 may be conformally deposited. In an embodiment, the upper electrode 223 may be formed by, e.g., a sputtering process, a PVD process, an ALD process, or a CVD process.

Figure 18:
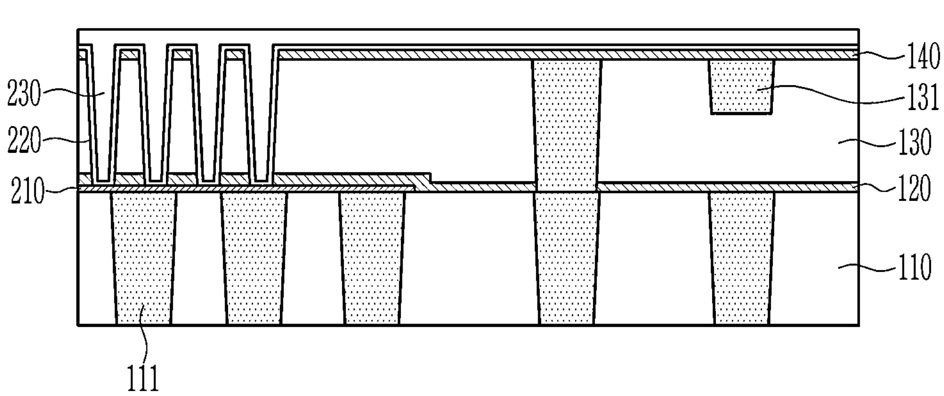
FIG. 18 illustrates a cross-sectional view of depositing an interconnect member on a capacitor structure, in a method of manufacturing a logic device including capacitor portions.

FIG. 18 illustrates a cross-sectional view of depositing the interconnect member 230 on the capacitor structure 220, in the method of manufacturing the logic device 100 including the capacitor portions 200.

Referring to FIG. 18, after forming the capacitor structure 220, the interconnect member 230 may be deposited on the upper surface of the upper electrode 223 over the through-holes 130A and in an empty space on the inner surface of the upper electrode 223. The interconnect member 230 may be formed to fill the space surrounded by the capacitor structure 220. An upper surface of the interconnect member 230 may be flatly formed. In an embodiment, the interconnect member 230 may be formed by, e.g., a sputtering process, a PVD process, an ALD process, or a CVD process.

Figure 19:
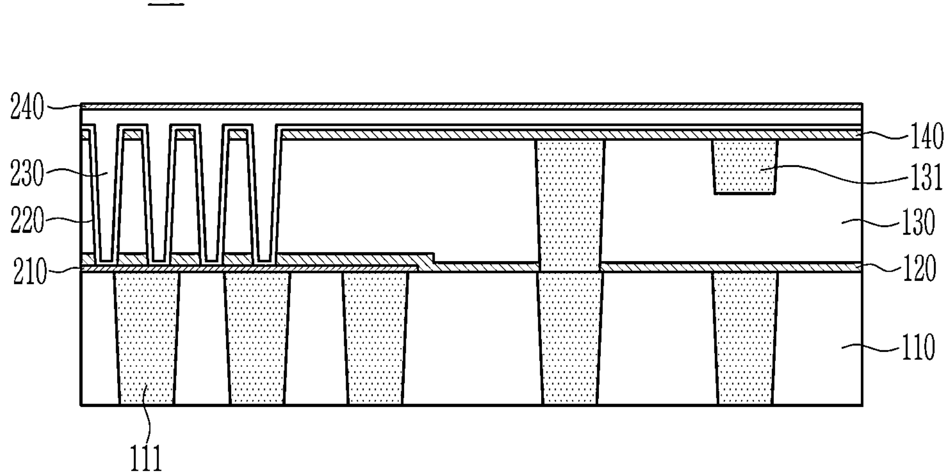
FIG. 19 illustrates a cross-sectional view of depositing an upper plate layer on an interconnect member, in a method of manufacturing a logic device including capacitor portions.

FIG. 19 illustrates a cross-sectional view of depositing the upper plate layer 240 on the interconnect member 230, in the method of manufacturing the logic device 100 including the capacitor portions 200.

Referring to FIG. 19, the upper plate layer 240 may be deposited on the upper surface of the interconnect member 230. In the embodiment, the upper plate layer 240 may be formed by, e.g., a sputtering process, a PVD process, an ALD process, or a CVD process.

Figure 20:
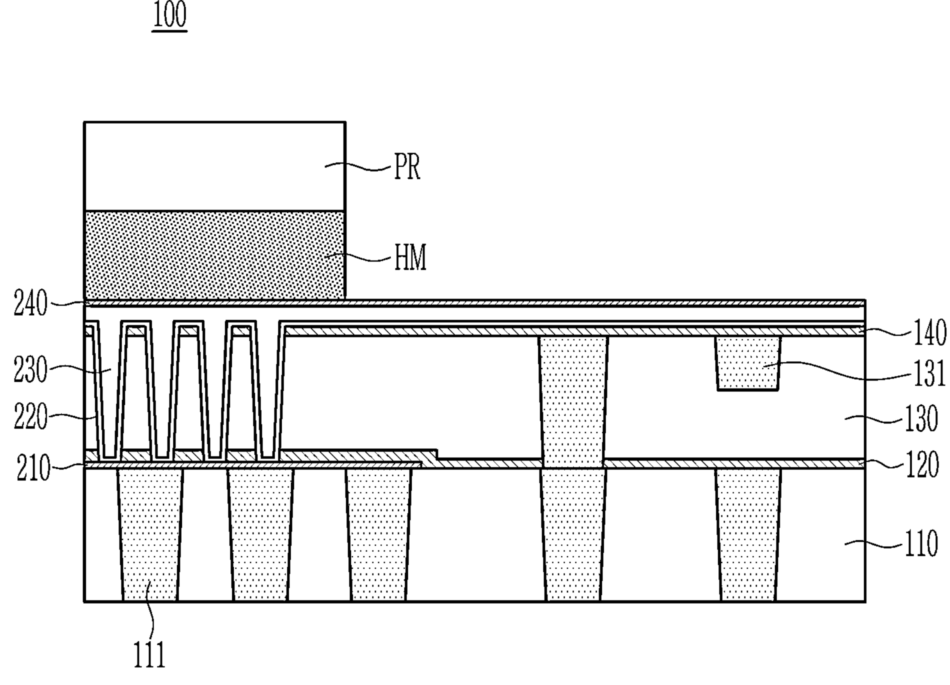
FIG. 20 illustrates a cross-sectional view of depositing a hard mask on an upper plate layer, depositing a photoresist on the hard mask, exposing and developing the photoresist, and etching the hard mask, in a method of manufacturing a logic device including capacitor portions.

FIG. 20 illustrates a cross-sectional view of depositing the hard mask HM on the upper plate layer 240, depositing the photoresist PR on the hard mask HM, exposing and developing the photoresist PR, and etching the hard mask HM, in a method of manufacturing the logic device 100 including capacitor portions 200.

Referring to FIG. 20, the hard mask HM may be deposited on the upper surface of the upper plate layer 240, and the photoresist PR film may be deposited on the upper surface of the hard mask HM, e.g., the hard mask HM and the photoresist PR may vertically overlap only a portion of the upper plate layer 240 (e.g., a portion including the through-holes). Then, the photoresist PR may be exposed and developed to form a pattern of the photoresist PR. Next, the hard mark HM may be etched using the patterned photoresist PR as an etch mask to form a pattern of the hard mask HM. The contents described in FIG. 4 may be equally applied to the formation process, material, and structure of the hard mask HM and the photoresist PR illustrated in FIG. 20.

Figure 21:
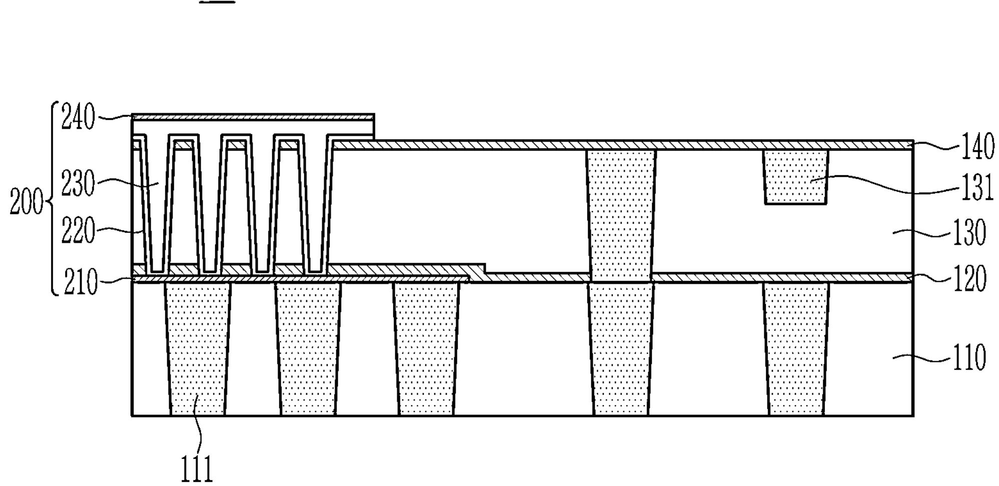
FIG. 21 illustrates a cross-sectional view of etching an upper plate layer, an interconnect member, and a capacitor structure, and removing a hard mask and a photoresist, in a method of manufacturing a logic device including capacitor portions.

FIG. 21 illustrates a cross-sectional view of etching the upper plate layer 240, the interconnect member 230, and the capacitor structure 220, and removing the hard mask HM and the photoresist PR, in a method of manufacturing the logic device 100 including capacitor portions 200.

Referring to FIG. 21, the upper plate layer 240, the interconnect member 230, and the capacitor structure 220, except for the portion in which the capacitor portion 200 is formed, are etched using the hard mask HM as an etch-stop layer. In an embodiment, the upper plate layer 240, the interconnect member 230, and the capacitor structure 220 may be etched by ion reactivity etching. After the etching process, the upper surface of the second etch-stop layer 140 is exposed, and the first insulating layer 130 and the first wires 131 are protected from etching by the second etch-stop layer 140.

Figure 22:
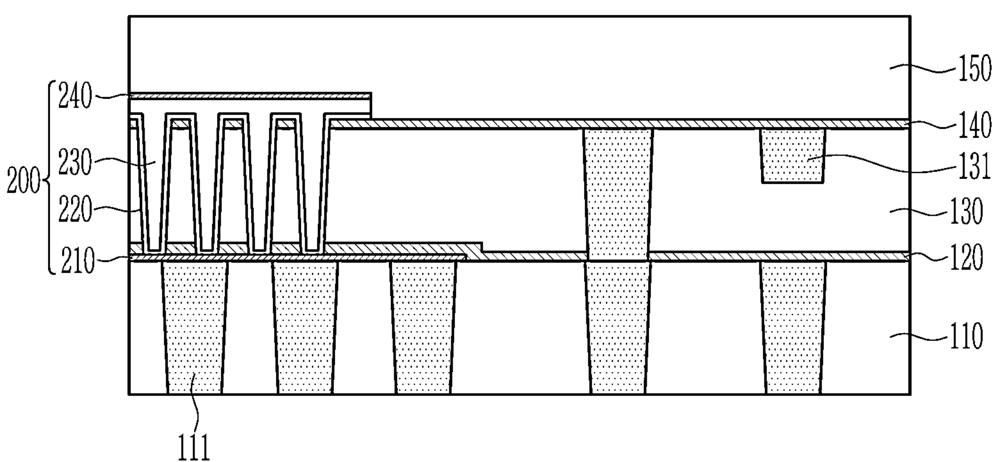
FIG. 22 illustrates a cross-sectional view of depositing a second insulating layer on a capacitor portion and a second etch-stop layer, in a method of manufacturing a logic device including capacitor portions.

FIG. 22 illustrates a cross-sectional view of depositing the second insulating layer 150 on the capacitor portion 200 and the second etch-stop layer 140, in the method of manufacturing the logic device 100 including the capacitor portions 200.

Referring to FIG. 22, the second insulating layer 150 may be deposited on the upper surface of the capacitor portion 200 and the second etch-stop layer 140. In the embodiment, the second insulating layer 150 may be film-formed by a thermal CVD process, a plasma enhanced CVD process, or an ALD process. The second insulating layer 150 may be formed of a material film having etch selectivity with respect to the second etch-stop layer 140.

Figure 23:
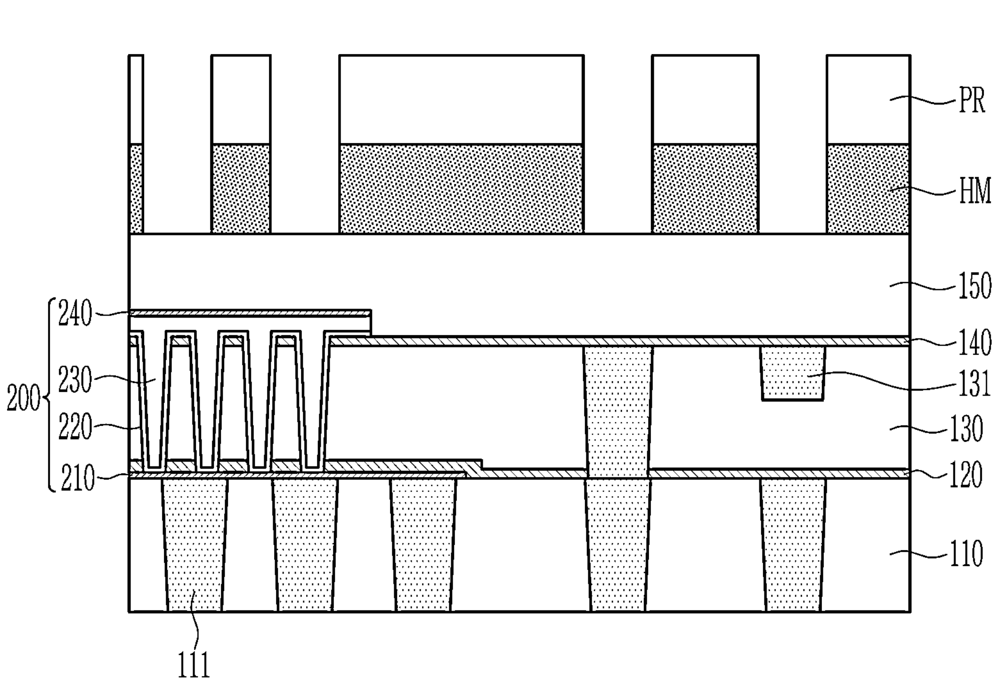
FIG. 23 illustrates a cross-sectional view of depositing a hard mask on a second insulating layer, depositing a photoresist on the hard mask, exposing and developing the photoresist, and etching the hard mask, in a method of manufacturing a logic device including capacitor portions.

FIG. 23 illustrates a cross-sectional view of depositing the hard mask HM on the second insulating layer 150, depositing the photoresist PR on the hard mask HM, exposing and developing the photoresist PR, and etching the hard mask HM, in the method of manufacturing the logic device 100 including the capacitor portions 200.

Referring to FIG. 23, first, the hard mask HM is deposited on the second insulating layer 150. Then, the photoresist PR is deposited on the hard mask HM. Then, the photoresist PR is exposed and developed to form a pattern of the photoresist PR. Next, the hard mark HM is etched using the patterned photoresist PR as an etch mask to form a pattern of the hard mask HM. The contents described in FIG. 4 may be equally applied to the formation process, material, and structure of the hard mask HM and the photoresist PR illustrated in FIG. 23.

Figure 24:
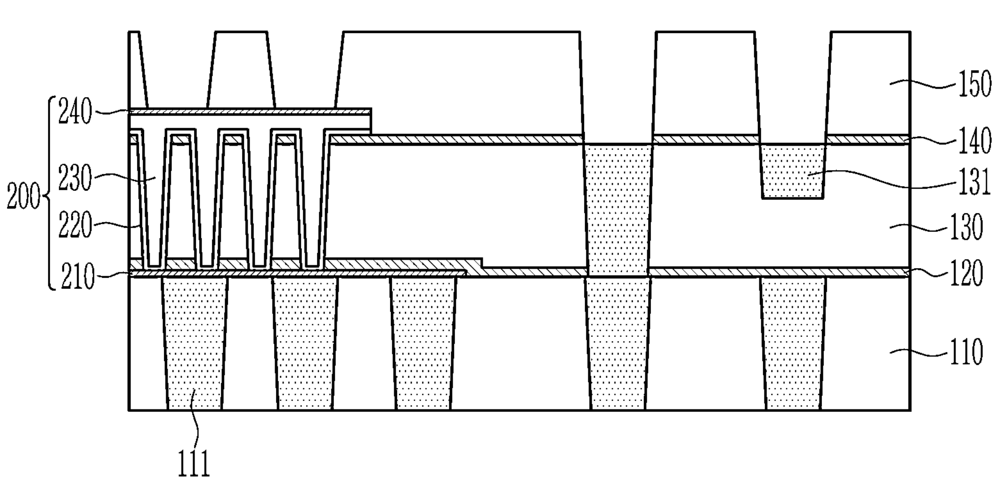
FIG. 24 illustrates a cross-sectional view of forming through-holes in a second etch-stop layer and a second insulating layer, in a method of manufacturing a logic device including capacitor portions.

FIG. 24 illustrates a cross-sectional view of forming the through-holes in the second etch-stop layer 140 and the second insulating layer 150, in the method of manufacturing the logic device 100 including the capacitor portions 200.

Referring to FIG. 24, the through-holes may be formed in the second insulating layer 150 by etching the second insulating layer 150 by using the hard mask HM as an etch mask. Then, the hard mask HM and the photoresist PR may be removed by, e.g., at least one of etching, ashing, and stripping.

Continuing from FIG. 24, FIG. 25 to FIG. 27 illustrate cross-sectional views of a single damascene process.

Figure 25:
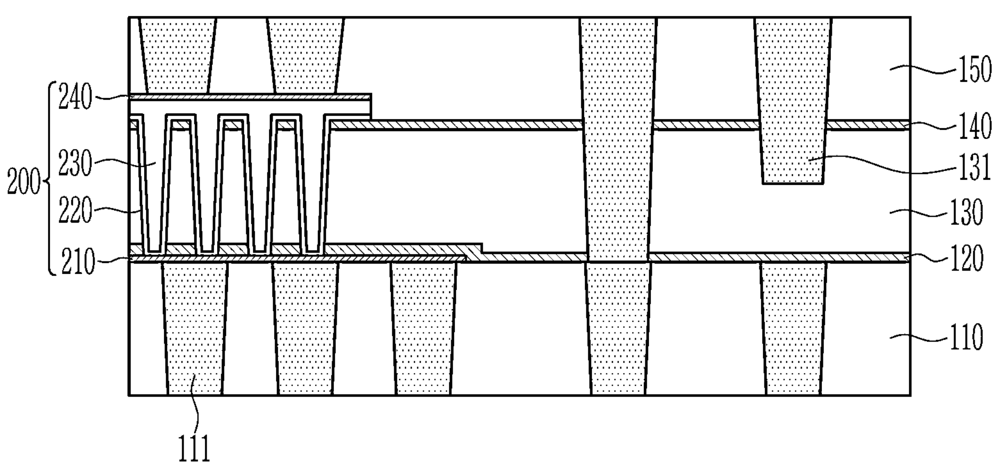
FIG. 25 illustrates a cross-sectional view of forming first wires in a second insulating layer by filling through-holes with a conductive material, in a method of manufacturing a logic device including capacitor portions.

FIG. 25 illustrates a cross-sectional view of forming the first wires 131 in the second insulating layer 150 by filling the through-holes with a conductive material, in the method of manufacturing the logic device 100 including the capacitor portions 200.

Referring to FIG. 25, the first wires 131 may be formed by filling the through-holes in the second insulating layer 150 with a conductive material. In an embodiment, the conductive material may be formed, e.g., filled in the through-holes, by a damascene process. In another embodiment, the conductive material may be formed, e.g., filled in the through-holes, by a sputtering process, a physical vapor deposition (PVD) process, an atomic layer deposition (ALD) process, or a chemical vapor deposition (CVD) process.

Figure 26:
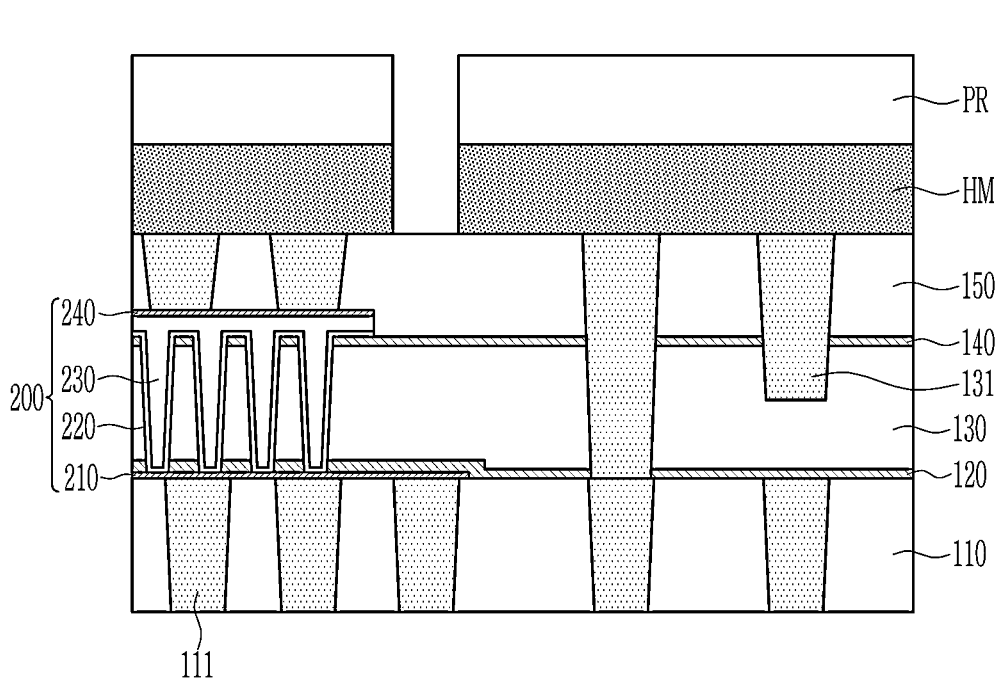
FIG. 26 illustrates a cross-sectional view of depositing a hard mask on first wires and a second insulating layer, depositing a photoresist on the hard mask, exposing and developing the photoresist, and etching the hard mask, in a method of manufacturing a logic device including capacitor portions.

FIG. 26 illustrates a cross-sectional view of depositing the hard mask HM on the first wires 131 and the second insulating layer 150, depositing the photoresist PR on the hard mask HM, exposing and developing the photoresist PR, and etching the hard mask HM, in the method of manufacturing the logic device 100 including capacitor portions 200.

Referring to FIG. 26, first, the hard mask HM may be deposited on the second insulating layer 150. Then, the photoresist PR may be deposited on the hard mask HM. Then, the photoresist PR may be exposed and developed to form a pattern of the photoresist PR. Next, the hard mark HM may be etched using the patterned photoresist PR as an etch mask to form a pattern of the hard mask HM. The contents described in FIG. 4 may be equally applied to the formation process, material, and structure of the hard mask HM and the photoresist PR illustrated in FIG. 26.

Figure 27:
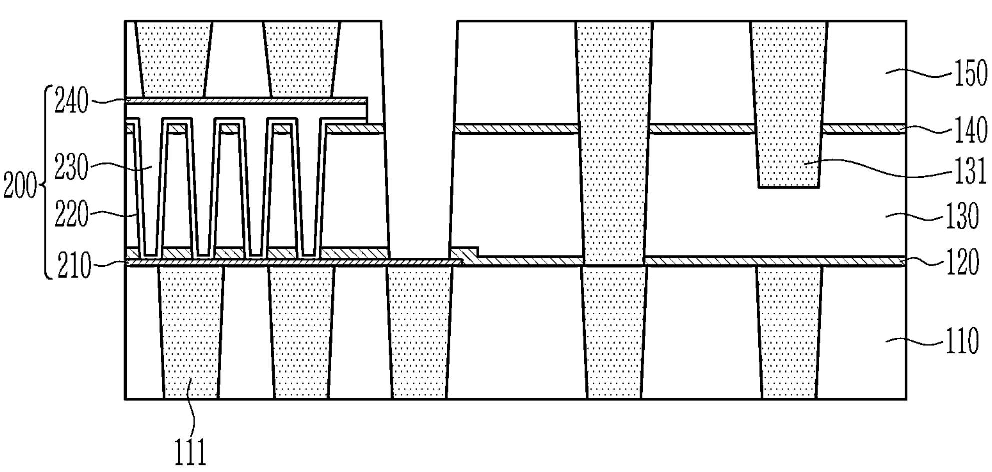
FIG. 27 illustrates a cross-sectional view of forming a through-hole in a first etch-stop layer, a second insulating layer, a second etch-stop layer, and a third insulating layer, in a method of manufacturing a logic device including capacitor portions.

FIG. 27 illustrates a cross-sectional view of forming the through-hole in the first etch-stop layer 120, the first insulating layer 130, the second etch-stop layer 140, and the second insulating layer 150, in the method of manufacturing the logic device 100 including the capacitor portions 200.

Referring to FIG. 27, the first etch-stop layer 120, the first insulating layer 130, the second etch-stop layer 140, and the second insulating layer 150 may be etched by using the hard mask HM as an etch mask to form the through-hole. After the etching process, the upper surface of the lower plate layer 210 may be exposed. Then, the hard mask HM and the photoresist PR may be removed by at least one of, e.g., etching, ashing, and stripping.

Figure 28:
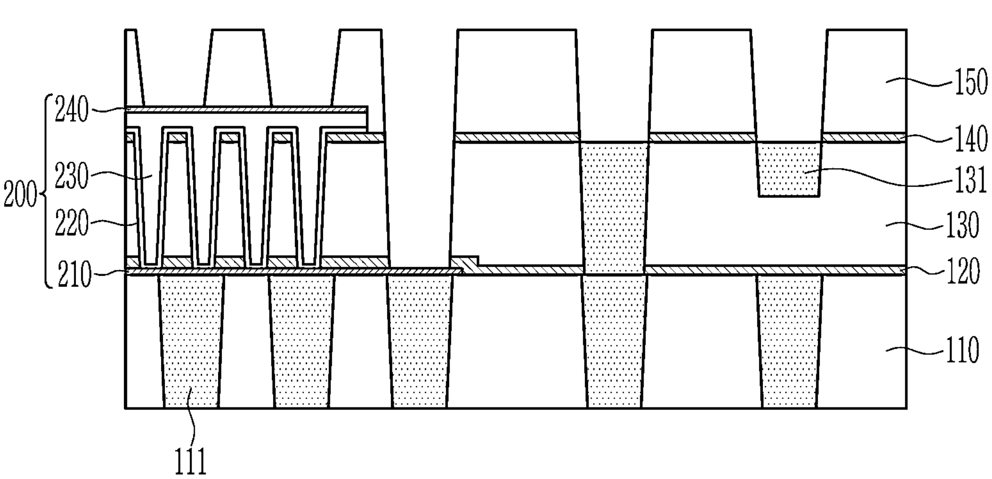
FIG. 28 illustrates a cross-sectional view of additionally forming a through-hole to form a wire connected to a lower plate layer by a dual damascene process following FIG. 24, in a method of manufacturing a logic device including capacitor portions.

Following FIG. 24, FIG. 28 illustrates a cross-sectional view of a dual damascene process.

FIG. 28 illustrates a cross-sectional view of additionally forming a through-hole to form a wire connected to the lower plate layer 210 by a dual damascene process following FIG. 24, in the method of manufacturing the logic device 100 including the capacitor portions 200.

Referring to FIG. 28, in addition to the through-holes in the second insulating layer 150 of FIG. 24, the first etch-stop layer 120, the first insulating layer 130, the second etch-stop layer 140, and the second insulating layer 150 may be etched to additionally form the through-hole. After the etching process, the upper surface of the lower plate layer 210 is exposed.

Figure 29:
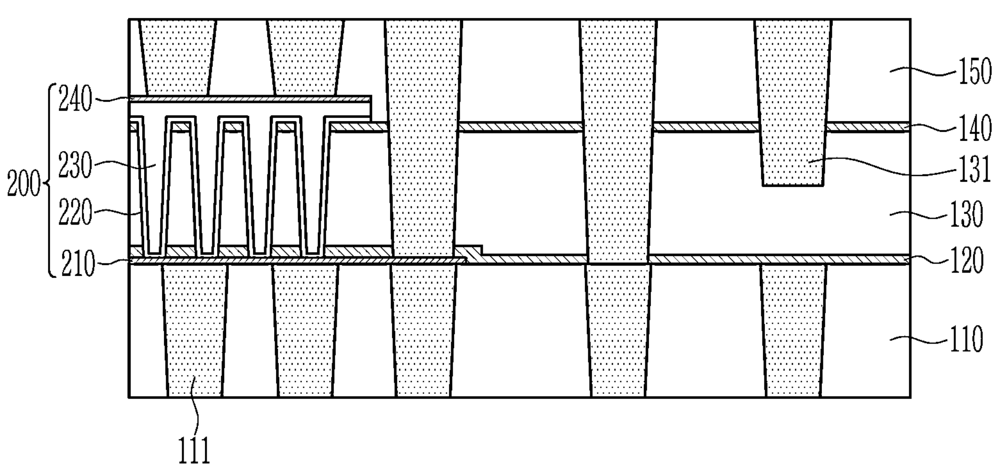
FIG. 29 illustrates a cross-sectional view of filling a through-hole to form a wire connected to a lower plate layer following each of FIG. 25 to FIG. 27 showing a single damascene process and FIG. 28 showing a dual damascene process, in a method of manufacturing a logic device including capacitor portions.

FIG. 29 illustrates a cross-sectional view of filling a through-hole to form a wire connected to the lower plate layer 210 following each of FIG. 25 to FIG. 27 showing a single damascene process and FIG. 28 showing a dual damascene process, in a method of manufacturing the logic device 100 including the capacitor portions 200.

Referring to FIG. 29, as an embodiment, following FIG. 24 to FIG. 27, the through-hole formed throughout the first etch-stop layer 120, the first insulating layer 130, the second etch-stop layer 140, and the second insulating layer 150 by a single damascene process may be filled with a conductive material to form the first wire 131. As another embodiment, following FIG. 24 and FIG. 28, the through-hole formed throughout the first etch-stop layer 120, the first insulating layer 130, the second etch-stop layer 140, and the second insulating layer 150 by a dual damascene process and the through-holes formed in the second insulating layer 150 may be filled with a conductive material by a single deposition process to form the first wires 131.

After this, the third etch-stop layer 160, the fourth insulating layer 170, and the third wires 171 may be formed on the upper surfaces of the second insulating layer 150 and the first wires 131.

By way of summation and review, plate-type MIM capacitors are embedded in currently mass-produced logic devices, and research and development to increase the capacitance of the MIM capacitors in the logic devices continues. However, the plate-type MIM capacitors have physical structural limitations that may limit capacitance increases. Therefore, it is necessary to develop a technology capable of including a structurally new type of capacitor in a logic device.

Therefore, example embodiments provide a logic device and a manufacturing method thereof in which a capacitor portion is disposed in an insulating layer, the capacitor portion includes a capacitor structure, and the capacitor structure extends continuously along the inside of a plurality of through-holes formed in the insulating layer and along an upper surface of the insulating layer around the plurality of through-holes. Accordingly, it is possible to increase capacitance and density of a capacitor within the logic device and improve power integrity (PI) characteristics thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A logic device, comprising:

a substrate;

at least one first insulating layer on the substrate, the at least one first insulating layer including a plurality of through-holes therein;

a second insulating layer on the at least one first insulating layer;

wires in the at least one first insulating layer and the second insulating layer; and a capacitor portion in the at least one first insulating layer and the second insulating layer, the capacitor portion including a capacitor structure with a lower electrode, a dielectric film, and an upper electrode, and the capacitor structure continuously extending inside the plurality of through-holes of the at least one first insulating layer and along an upper surface of the at least one first insulating layer around each of the plurality of through-holes, wherein a ratio of a width of each of the plurality of through-holes to a width of each of the wires is 1:5 to 1:10.

2. The logic device as claimed in claim 1, wherein:

the lower electrode conformally extends inside the plurality of through-holes and along the upper surface of the at least one first insulating layer around each of the plurality of through-holes, the dielectric film conformally extends along the lower electrode, and the upper electrode conformally extends along the dielectric film.

3. The logic device as claimed in claim 1, wherein the capacitor portion further includes an interconnect member on the capacitor structure, the interconnect member including:

a first area having a plurality of filling plugs filling the plurality of through-holes on the capacitor structure, and a second area having a plate member electrically connecting the plurality of filling plugs.

4. The logic device as claimed in claim 3, wherein the capacitor portion further includes a lower plate layer and an upper plate layer.

5. The logic device as claimed in claim 4, wherein:

the capacitor structure is on the lower plate layer, and the upper plate layer is on the interconnect member.

6. The logic device as claimed in claim 1, wherein the lower electrode and the upper electrode include TiN.

7. The logic device as claimed in claim 1, wherein the dielectric film includes at least one of Zr oxide, Al oxide, and Ti oxide.

8. A logic device, comprising:

a substrate;

at least one first insulating layer on the substrate, the at least one first insulating layer including a plurality of through-holes;

a second insulating layer on the at least one first insulating layer;

wires in the at least one first insulating layer and the second insulating layer; and a capacitor portion in the at least one first insulating layer and the second insulating layer, the capacitor portion including:

a lower plate layer, a first portion of the wires being electrically connected to the lower plate layer, a capacitor structure on the lower plate layer, the capacitor structure continuously extending along an upper surface of the lower plate layer, an inner surface of the plurality of through-holes, and an upper surface of the at least one first insulating layer around each of the plurality of through-holes, an interconnect member on the capacitor structure, and an upper plate layer on the interconnect member, a second portion of the wires being electrically connected to the upper plate layer, wherein a ratio of a width of each of the plurality of through-holes to a width of each of the wires is 1:5 to 1:10.

9. The logic device as claimed in claim 8, wherein the lower plate layer and the upper plate layer include TiN.

10. The logic device as claimed in claim 8, wherein the interconnect member includes Al.

11. The logic device as claimed in claim 8, further comprising an etch-stop layer between the capacitor structure and the upper surface of the at least one first insulating layer around each of the plurality of through-holes.

12. The logic device as claimed in claim 11, wherein the etch-stop layer includes SiN.

13. The logic device as claimed in claim 8, wherein a ratio of a width of each of the plurality of through-holes to a width of the capacitor structure is 4:1 to 12:1.

14. The logic device as claimed in claim 8, wherein the capacitor portion is included in a back end of line.

15. A manufacturing method of a logic device, the method comprising:

forming a lower plate layer and a first insulating layer on a substrate, such that the lower plate layer is between the substrate and the first insulating layer;

forming a plurality of wires in the first insulating layer;

forming a plurality of through-holes in the first insulating layer to expose the lower plate layer;

forming a capacitor structure in the plurality of through-holes of the first insulating layer, such that the capacitor structure continuously extends along an upper surface of the lower plate layer exposed by the plurality of through-holes, along inner surfaces of the plurality of through-holes, and an upper surface of the first insulating layer;

forming a plurality of filling plugs filling the capacitor structure in the plurality of through-holes, and depositing a plate member connecting the plurality of filling plugs on the plurality of filling plugs;

depositing an upper plate layer on the plate member;

etching the capacitor structure, the plate member, and the upper plate layer in an area in which the plurality of wires are formed; and forming a first wire connected to the upper plate layer and a second wire connected to the lower plate layer.

16. The manufacturing method of the logic device as claimed in claim 15, wherein forming the first wire connected to the upper plate layer and the second wire connected to the lower plate layer includes forming each of the first wire and the second wire by a single damascene process.

17. The manufacturing method of the logic device as claimed in claim 15, wherein forming the first wire connected to the upper plate layer and the second wire connected to the lower plate layer includes forming the first wire and the second wire by a dual damascene process.

18. The manufacturing method of the logic device as claimed in claim 15, wherein forming the plurality of wires is performed by a dual damascene process.

* * * * *